United States Patent
Agut

(10) Patent No.: US 8,476,941 B2
(45) Date of Patent: Jul. 2, 2013

(54) BUFFER CIRCUIT FOR A CAPACITIVE LOAD OF HIGH VALUE

(75) Inventor: François Agut, Saint Vital (FR)

(73) Assignee: STMicroelectronics SA, Montrouge (FR)

( * ) Notice: Subject to any disclaimer, the term of this patent is extended or adjusted under 35 U.S.C. 154(b) by 126 days.

(21) Appl. No.: 13/090,687

(22) Filed: Apr. 20, 2011

(65) Prior Publication Data

US 2011/0260756 A1   Oct. 27, 2011

(30) Foreign Application Priority Data

Apr. 21, 2010 (FR) .................................. 10 53028

(51) Int. Cl.
*H03B 1/00* (2006.01)

(52) U.S. Cl.
USPC ........... 327/111; 327/108; 327/170; 327/371; 326/27; 326/88

(58) Field of Classification Search
USPC ................. 327/108–112, 170, 379–381, 391; 326/26–27, 82–83, 86–87
See application file for complete search history.

(56) References Cited

U.S. PATENT DOCUMENTS 6,828,833 B1   12/2004   Guebels
7,948,272 B2 *   5/2011   Lee et al. ........................ 327/77

OTHER PUBLICATIONS

Republique Francaise Institut National De La Propriete Industrielle, Rapport de Recherche Preliminaire (Preliminary Search Report); issued in French Patent Application No. 10-53028 on Dec. 13, 2010 (2 pages).

* cited by examiner

Primary Examiner — An Luu
(74) Attorney, Agent, or Firm — Slater & Matsil, L.L.P.

(57) ABSTRACT

A buffer circuit including an input terminal capable of receiving an input signal and an output terminal capable of being connected to a capacitive load, including an output circuit a series connection, between two terminals of application of a power supply voltage, of a first MOS transistor, a first and a second resistor of adjustable values, and a second MOS transistor, and means for controlling said first and second transistors receiving the input signal The buffer circuit further includes means for comparing the voltage on the output terminal of the circuit with at least one threshold voltage, the comparison means being connected to said control means.

20 Claims, 4 Drawing Sheets

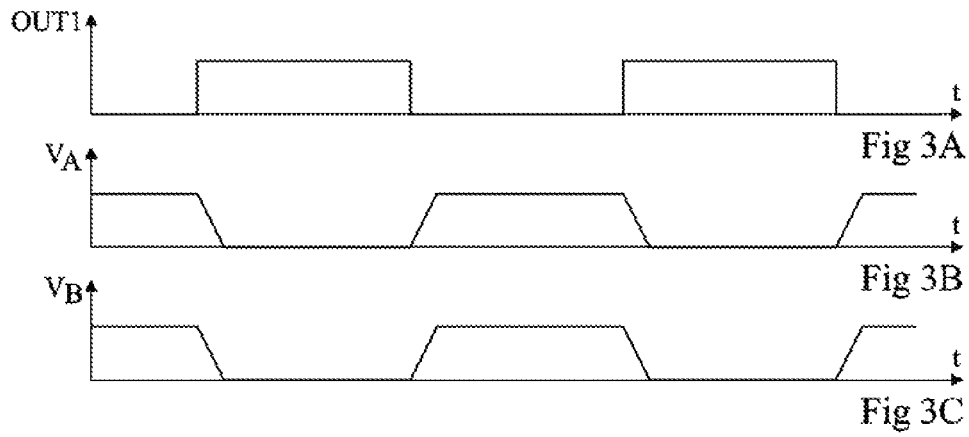
Fig 3A
Fig 3B
Fig 3C
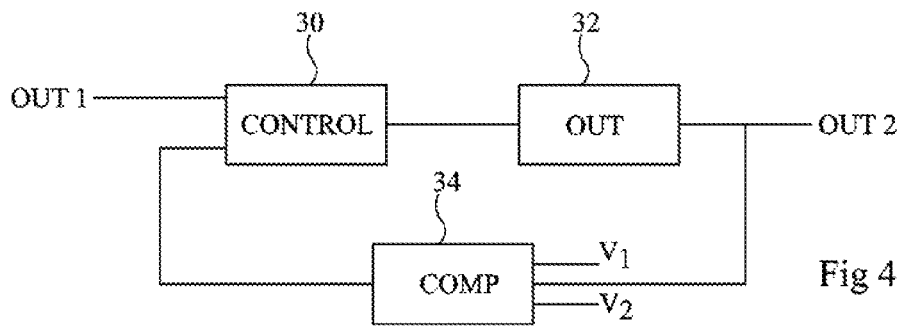
Fig 4
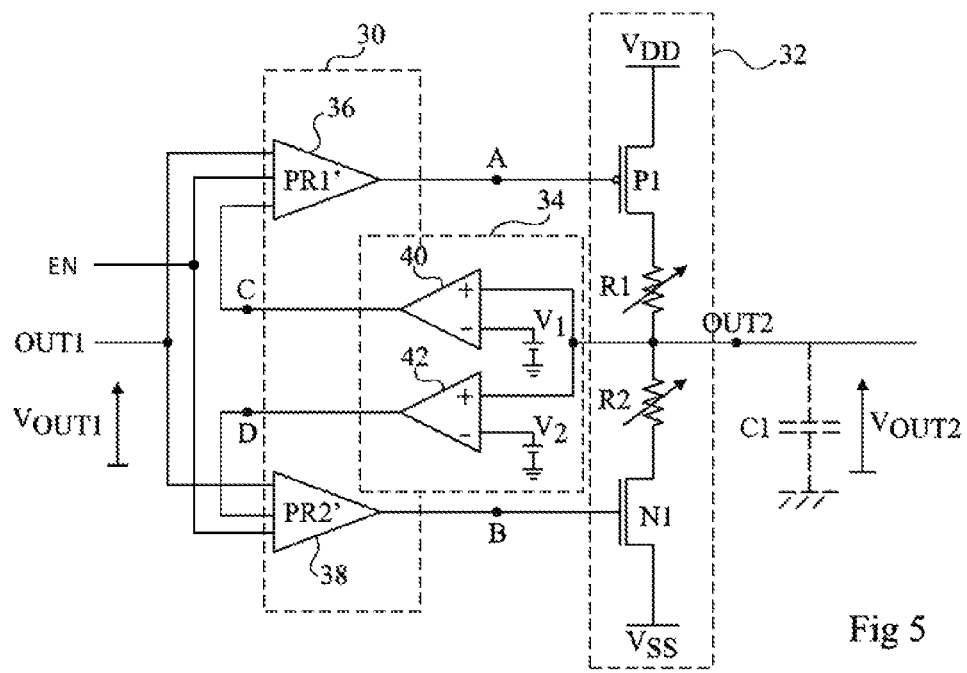
Fig 5

US 8,476,941 B2

BUFFER CIRCUIT FOR A CAPACITIVE LOAD OF HIGH VALUE

CROSS REFERENCE TO RELATED APPLICATIONS

This application claims the benefit of French Patent Application No. 10/53028, filed Apr. 21, 2010 and entitled "Buffer Circuit For a Capacitive Load of High Value," which is hereby incorporated by reference to the maximum extent allowable by law.

TECHNICAL FIELD

The present invention relates to buffer circuits intended to match the output of a data transmission circuit with a capacitive load of high value.

BACKGROUND

Buffer circuits are circuits having an output similar to their input, but where shape and/or amplitude deformations likely to affect the input have been corrected. Buffer circuits thus enable adjusting the level of a signal which might otherwise be wrongly interpreted if no buffer was used. The buffers considered herein enable one to transform a high input impedance into a low output impedance.

In the case of buffers intended to power a capacitive load, problems may appear if the capacitive load has a high value and if the signal to be transmitted also has a high frequency. Indeed, in this case, the capacitive load may not have time to charge/discharge and thus to switch state on each state switching of the circuit input. To avoid this, the circuits are generally provided so that the capacitive load placed at the circuit output has a rise and fall time on the order of a bit transmission time. For a transmission to be of good quality, sufficient detection times of the high or low states at the output of a buffer must, however, be provided.

FIG. 1 shows a known buffer receiving, on an input terminal OUT1, a signal originating from the output of a data processing circuit (not shown). The circuit of FIG. 1 comprises, between two terminals of a power supply voltage (in the shown example, a first terminal at a high voltage VDD and a second terminal at a low voltage VSS), a series association, starting from the terminal of highest voltage (VDD), of a P-channel MOS transistor P1, a first resistor of variable value R1, a second resistor of variable value R2, and an N-channel MOS transistor N1. The gate of transistor P1 is connected to a node A of application of a voltage for controlling transistor P1 and the gate of transistor N1 is connected to a node B of application of a voltage for controlling transistor N1. The buffer output, OUT2, is connected to the connection node between resistors R1 and R2. The values of resistors R1 and R2 are generally provided to have equal resistances on either side of output OUT2, between power supply terminals VDD and VSS when transistors P1 and N1 are on (the on-state resistances of transistors P1 and N1 being most often different). Output OUT2 powers a capacitive load C (shown in dotted lines in FIG. 1).

Input terminal OUT1 of the circuit is connected to a first input terminal of a first control circuit PR1 having its output connected to node A, and to a first input terminal of a second control circuit PR2 having its output connected to node B. Control circuits PR1 and PR2 further receive, on a second input terminal, a signal EN for enabling the circuit. Control circuits PR1 and PR2 are provided to transmit an instruction on the gates of transistors P1 and N1 to turn on one or the other of these transistors, and thus to connect output OUT2 alternately to high voltage $V_{DD}$ or to low voltage $V_{SS}$, according to the value of input and enable signals OUT1 and EN.

Enable signal EN may be in a first state when the circuit is not being used, for example, during phases when it is known that no data transmission is carried out. In this case, circuits PR1 and PR2 turn off transistors P1 and N1. When the circuit is being used (signal EN in a second state) and input voltage OUT1 is in the high state, control circuit PR1 forces the voltage at node A to zero. This turns on transistor P1 and connects output OUT2 to voltage $V_{DD}$. Meanwhile, control circuit PR2 imposes a voltage at node B in the low state, to turn off transistor N1. Conversely, when input signal OUT1 is low, the voltages at nodes A and B are high.

FIG. 2 illustrates curves of the signal on output OUT2 according to different values of input OUT1 over a duration equal to two bit times (approximately 2 ns). This specific timing diagram shape is conventionally called an eye diagram. In the example of FIG. 2, a capacitive load C of approximately 10 pF is connected to output OUT2 and the data transmission frequency is on the order of 530 MHz. Conventionally, "bit time" designates half the data transmission period, when the transmit system is used in double data rate (DDR). For a data transmission frequency on the order of 530 MHz, the bit time is thus slightly shorter than one nanosecond.

In the curves illustrated in FIG. 2, a first set of curves 10 for which the value of output $V_{OUT2}$ remains constant and equal to $V_{DD}$, in the shown example, to 1.2 V, may first be observed. This first set of curves illustrates the case where input OUT1 remains in the high state for several bit times. A second set of curves 12 corresponding to an output voltage $V_{OUT2}$ equal to low power supply voltage $V_{SS}$, that is, in the shown example, equal to 0 V, may also be observed. This second set of curves illustrates the case where input OUT1 remains in the low state for several bit times.

A third set of curves 14 corresponds to the signal on output OUT2 in the case where, before a time t=0, input OUT1 is in the low state, then switches to the high state for the entire shown duration, that is, for two bit times. In this case, the curve of output OUT2 follows the charge curve of a capacitor of high value, that is, at the end of the first bit time (t≈1 ns), the capacitor at the output of the circuit of FIG. 1 is not fully charged ($V_{OUT2}<V_{DD}$). Symmetrically, a fourth set of curves 16 corresponds to the case where, before time t=0, input OUT1 is in the high state, and then switches to the low state for at least two bit times. In this case, curves 16 follow the discharge curve of a capacitor of high value, that is, at the end of the first bit time, the capacitor is not fully discharged ($V_{OUT2}>V_{SS}$).

A fifth set of curves 18 corresponds to the case where the capacitor is initially discharged at time t=0, after which input OUT1 switches to a high state, and then to a low state in the next two bit times. In this case, the capacitor charges to a certain point at the end of the first bit time, then discharges. It should be noted that, in this case, the maximum value reached by output voltage $V_{OUT2}$ is lower than high power supply voltage $V_{DD}$. Symmetrically, a sixth set of curves 20 shows the case where input OUT1 switches from a high state to a low state, then back to a high state. In this case, voltage $V_{OUT2}$ does not reach the low voltage of power supply VSS and reaches at least a value on the order of 0.2 V.

Thus, according to the past state of voltage $V_{OUT2}$, different curves appear. Further, in a same set of curves, slight differences appear. Such differences are also due to the past of the circuit, for example to the duration for which the circuit input is in a first state before proceeding to a second state.

Based on the curves illustrated in FIG. 2, several parameters enabling one to qualify the quality of the transmission obtained by the circuit of FIG. 1 are defined. Indeed, for the output state on output terminal OUT2 to be clearly determinable by a circuit placed downstream of the circuit of FIG. 1, the voltage on output OUT2, in the high state or in the low state, must be able to be detected during a relatively long time. The circuit placed downstream of the circuit of FIG. 1 generally comprises comparators of voltage $V_{OUT2}$ with high and low reference voltages.

In the example of FIG. 2, a high detection voltage equal to 0.9 V in the shown example, has been called V+, and a low detection voltage, equal to 0.3 V in the shown example, has been called V−. When the voltage on output terminal OUT2 is between V+ and V−, no detection can be performed. When voltage $V_{OUT2}$ is greater than V+, a high state is detected, and conversely, when voltage $V_{OUT2}$ is smaller than voltage V−, a low state is detected.

To qualify the quality of a buffer, the minimum duration for which a logic '1' or '0' can be measured is called an "eye opening". In the example of FIG. 2, this duration corresponds to the duration for which, in the critical case of curves 18, a '1' can be detected (duration T1) and, in the opposite case, for critical curves 20, to minimum time T2 for which a '0' can be detected at the circuit output. The larger the eye opening (T1 and T2), the better the quality of the transmission and the buffer.

The circuit jitter, corresponds to a duration T3 between the time when a first one of the curves of FIG. 2 switches from average power supply value $(V_{DD}-V_{SS})/2$ and the time when the last curve switches to this same value during a bit time. The lower the jitter of a circuit, the less chances there are for data to be poorly detected at the circuit output.

FIGS. 3A, 3B, and 3C are timing diagrams respectively illustrating an input signal OUT1 and signals corresponding to node A ($V_A$) and to node B ($V_B$) provided by control circuits PR1 and PR2, in the case where the circuit is enabled (signal EN does not influence control circuits PR1 and PR2). When input voltage OUT1 changes value, voltages $V_A$ and $V_B$ also change values with a given delay not shown in the timing diagrams of FIGS. 3A to 3C. Preferably, the signals at nodes A and B do not abruptly switch values but exhibit constant slopes before reaching the final value to avoid large current surges in the power supply branch of the load placed on output OUT2 at the powering-on of transistor P1 and N1.

There is a need for a buffer capable of powering a capacitive load of high value having a low jitter and a large eye opening.

SUMMARY OF THE INVENTION

The foregoing objects, features, and advantages of the present invention will be discussed in detail in the following non-limiting description of specific embodiments in connection with the accompanying drawings.

BRIEF DESCRIPTION OF THE DRAWINGS

For a more complete understanding of the present invention, and the advantages thereof, reference is now made to the following descriptions taken in conjunction with the accompanying drawings, in which:

FIGS. 3A to 3C, previously described, illustrate signals for controlling the transistors of the circuit of FIG. 1 according to variations of the input voltage of the circuit;

FIG. 4 is a block diagram of a buffer according to an embodiment of the present invention;

FIG. 5 illustrates a buffer according to an embodiment of the present invention;

DETAILED DESCRIPTION OF ILLUSTRATIVE EMBODIMENTS

Figure 1:
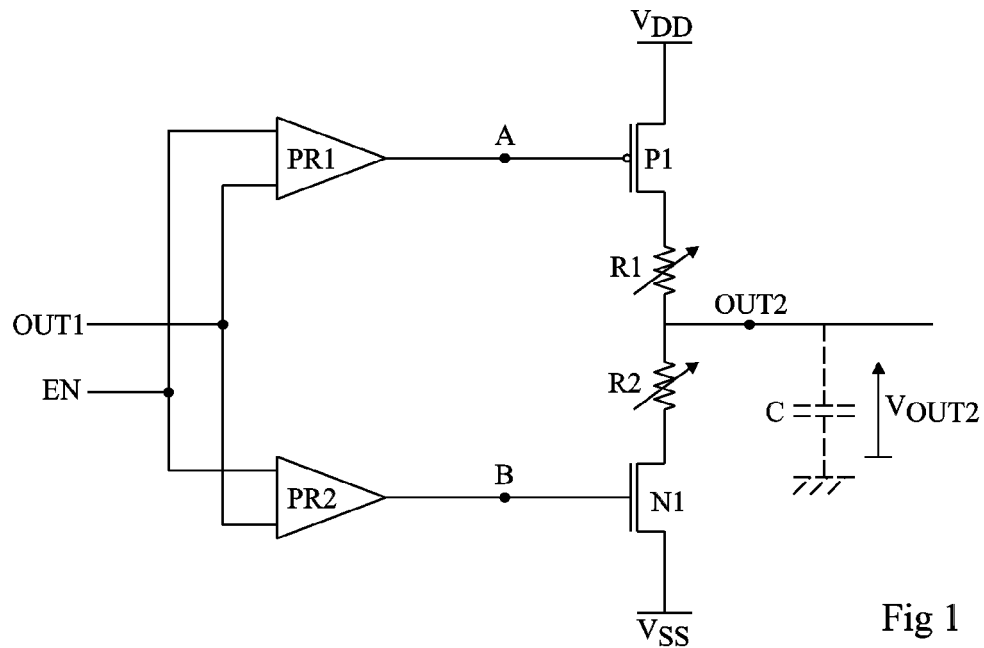
FIG. 1 previously described, illustrates a known buffer and its control circuit.

Before addressing the illustrated embodiments in detail, objects and advantages of embodiments of the invention will be discussed generally. An object of an embodiment of the present invention is to provide a buffer enabling an improved data transmission. Another object of an embodiment of the present invention is to provide a buffer having a large eye opening and a low jitter.

To obtain a buffer with a large opening and a low jitter, the transistors constitutive of a buffer connecting an output capacitive load to a high or low power supply are disconnected when the output voltage exceeds a predetermined threshold.

Thus, an embodiment of the present invention provides a buffer circuit comprising an input terminal capable of receiving an input signal and an output terminal capable of being connected to a capacitive load, comprising: an output circuit comprising at least a series connection, between two terminals of application of a power supply voltage, of a first MOS transistor, a first and a second resistor of adjustable values, and a second MOS transistor, and having an output connected to a node of connection of the first and second resistors, means for controlling the first and second transistors receiving the input signal, and means for comparing the voltage on the output terminal of the circuit with at least one threshold voltage, the comparison means being connected to the control means.

According to an embodiment of the present invention, the comparison means comprise a first and a second comparators, each receiving, on one of their input terminals, the signal from the circuit output and, on a second input terminal, respectively, a first and a second threshold voltages.

According to an embodiment of the present invention, the control means comprise a first and a second control circuits having their output respectively connected to the respective gate of the first and second MOS transistors, and having at least a first input connected to the input terminal of the circuit and having a second input respectively connected to the output of the first and of the second comparator.

According to an embodiment of the present invention, the first control circuit is provided to turn on the first MOS transistor when the signal on the input terminal is in a high state and to turn off the first MOS transistor when the output of the first comparator is in a state corresponding to an output voltage of the circuit greater than the first threshold voltage.

According to an embodiment of the present invention, the second control circuit is provided to turn on the second MOS transistor when the signal on the input terminal is in a low state and to turn off the second MOS transistor when the output of the second comparator is in a state corresponding to an output voltage of the circuit smaller than the second threshold voltage.

According to an embodiment of the present invention, the first and second threshold voltages are equal.

According to an embodiment of the present invention, the buffer circuit further comprises a second input terminal, intended to receive a signal for enabling the circuit, connected to the input of the first and second control means, the first and second control means being provided to operate normally when the enable signal is in a first state and to turn off the first and second transistors when the enable signal is in a second state.

According to an embodiment of the present invention, the input signal on the input terminal has a 530-MHz frequency.

FIG. 4 is a block diagram of a circuit according to an embodiment of the present invention. In FIG. 4, the buffer receives output signal OUT1 of an electronic circuit, not shown. Signal OUT1 is applied to a system 30 (CONTROL) for controlling an output circuit 32 (OUT). Output OUT2 of output circuit 32 is intended to power a capacitive load of high value. A comparison system 34 (COMP) receives, on one of its inputs, output OUT2 of the circuit and, on one or several other inputs, one or several reference values $V_1$, $V_2$. The output of comparison system 34 is connected to control system 30.

The device of FIG. 4 operates as follows. When the value of input OUT1 varies, the value of output OUT2 also varies, with a delay due to the propagation through the different components of control system 30 and of output circuit 32. Due to the high value of the capacitive load placed at the circuit output, output OUT2 varies relatively slowly. Comparator 34 detects the time when the voltage of output OUT2 exceeds a first threshold $V_1$, in the case of a charge, or falls below a value $V_2$, in the case of a discharge of the capacitance placed at the circuit output. When comparator 34 detects that output signal $V_{OUT2}$ of the circuit has exceeded a first threshold ($V_1$) during the charge or has fallen below the second threshold ($V_2$) during the discharge, control means 30 turn off the transistors of output circuit 32 and thus the value on output $O_{UT2}$.

By specifying in adapted fashion the values of threshold voltages $V_1$ and $V_2$, the system can thus be locked to an output voltage OUT2 smaller than $V_{DD}$ (high power supply voltage) in the case of a charge and greater than $V_{SS}$ (low power supply voltage) in the case of a discharge. It will however be ascertained that output voltage $V_{OUT2}$ is nonetheless capable of representing a logic '0' or '1' to be detected by a circuit placed downstream of output circuit 32. This enables, as will be seen hereafter, increasing the eye opening of the device and strongly decreasing the jitter of this circuit.

FIG. 5 illustrates an embodiment of an output circuit according to an embodiment of the present invention. Output circuit 32 conventionally comprises the series connection, between two terminals VDD and VSS of application of a D.C. power supply voltage, of a first P-channel transistor P1, a first variable resistor R1, a second variable resistor R2, and a second N-channel transistor N1. It should be noted that transistors having channels of different conductivity type may also be provided, the control signals applied to the gates of these transistors being then accordingly matched. Output OUT2 of the buffer is connected between resistors R1 and R2.

The gate of transistor P1 is connected to a node A corresponding to the output of a first control circuit 36, PR1', and the gate of transistor N1 is connected to a node B corresponding to the output of a second control circuit 38, PR2'. Control circuits PR1' and PR2' receive signal OUT1 on a first input.

Comparison system 34 of FIG. 4 is formed, in the example of FIG. 5, of two comparators 40 and 42 receiving the voltage of output OUT2 on a first input. A second one of their inputs respectively receives reference voltages $V_1$ and $V_2$. The outputs of comparators 40, 42, respectively C and D, are connected to a respective input of control circuits 36 and 38. According to the result of the comparison between the value of the signal on output $V_{OUT2}$ and threshold voltages $V_1$ and $V_2$, the signals at nodes C and D vary. As will be seen hereafter, the variation of the signals on nodes C and D causes the turning-off of transistors P1 or N1.

As in the case of FIG. 1, an enable input EN may also be provided on the circuit of FIG. 5. This input will be connected to control circuits 36 and 38 and may for example enable to disable the buffer when it is not performing any transmission.

FIGS. 6A to 6H are timing diagrams respectively illustrating the state of input OUT1, voltage $V_A$ at node A, the state of transistor P1, voltage $V_C$ at node C, voltage $V_B$ at node B, the state of transistor N1, voltage VD at node D, and the signal on output OUT2 of the circuit. In this example, values $V_1$ and $V_2$ (see FIG. 5) equal to (VDD−VSS)/2 will be considered, VSS being grounded (voltage equal to zero).

At a time t1, input voltage OUT1 switches from 0 to 1. This causes, at a subsequent time t2, the switching to the low state of voltage $V_A$ at node A (control signal of transistor P1). This causes the turning-on (ON) of transistor P1, at a time t3 subsequent to time t2. Thus, from time t3, the load placed at the circuit output is connected to voltage $V_{DD}$, through transistor P1, which causes the charge of capacitor C1.

At a time t4 subsequent to time t3, output voltage OUT2 of the circuit becomes greater than $V_{DD}/2$ (reference voltage $V_1$), which causes the switching to the high state of voltage $V_C$ at node C. This switching to the high state occurs at time t5 subsequent to time t4. Control circuit PR1' is provided so that the switching to the high state of the voltage at node C causes the switching to the high state of the voltage at node A controlling transistor P1, at a time t6. This then causes the turning-off, at a time t7, of transistor P1. Thus, from time t7 and until a new switching of input voltage OUT1, output voltage OUT2 of the circuit remains constant, at the value that it has reached at time t7.

Symmetrically, at a time t'1, input voltage OUT1 switches to a low state. This causes the switching, at a time t'2, of the voltage at node B to a high state, and thus the switching, at a time t'3, of transistor N1 to an on state (ON).

From time t'3, output OUT2 of the circuit is connected to ground ($V_{SS}$) via transistor N1. This causes the discharge of capacitance C1 placed at the circuit output. At a time t'4, the output voltage of the circuit switches to a value smaller than $V_{DD}/2$ ($V_2$). This causes the switching, at a time t'5, of the voltage at node D to a high state and causes, at a time t'6, the switching to a low state of the voltage at node B. Thus, from a time t'7 subsequent to time t'6, transistor N1 turns off (OFF). Thus, the voltage on output terminal OUT2 of the circuit remains constant, at the value that it has reached at time t'7, since capacitor C1 has a high capacitance, until a new switching of input OUT1.

It should be noted that, as illustrated at the end of the second period of the timing diagrams of FIGS. 6A to 6H, the maintaining of data OUT1 at a fixed voltage for several bit times implies a constant voltage on output OUT2, greater than voltage $V_{SS}$ in the case where input voltage VOUT1 is at zero, and lower than $V_{DD}$ in the case where input voltage VOUT1 is in the high state.

In the example of FIGS. 6A to 6H, the voltages at nodes A and B have been shown as having instantaneous value switchings. Conventionally, control circuits PR1' and PR2' may be capable of providing progressive control signals such as those illustrated in FIGS. 3A to 3C.

Further, it has been arbitrarily decided to set the voltage at node C to a high state when the output voltage is greater than $V_{DD}/2$ and the voltage at node D to a high state when the output voltage is smaller than $V_{DD}/2$. It should be noted that control circuits PR1' and PR2' may be adapted to the case where the voltages at node C and D are inverse to those shown herein, and also where voltages $V_1$ and $V_2$ are different.

In the timing diagrams of FIGS. 6A to 6H, the operation of the circuit of FIG. 5 has been shown by considering a non-zero switching time of transistors N1 and P1, shorter than the switching time of comparators 40 and 42. A non-zero switching time of control circuits 36 and 38, greater than the switching time of comparators 40 and 42, has also been considered. Generally, the switching times will be variable. In practice, transistors P1 and N1 may have a switching time on the order of 50 ps, comparators 40 and 42 may have a switching time of the order of 150 ps, and control circuits 36 and 38 may have a switching time ranging between 150 and 250 ps. It should be noted that the man skilled in the art will be able to design control circuits 36 and 38 to obtain the behavior described in connection with FIGS. 6A to 6H.

For the circuit of FIG. 5 to operate properly, the bit transmission time must be greater than or equal to the possible general circuit delay during a switching cycle. With the above numerical values, a bit time slightly shorter than one nanosecond may be provided.

Figure 2:
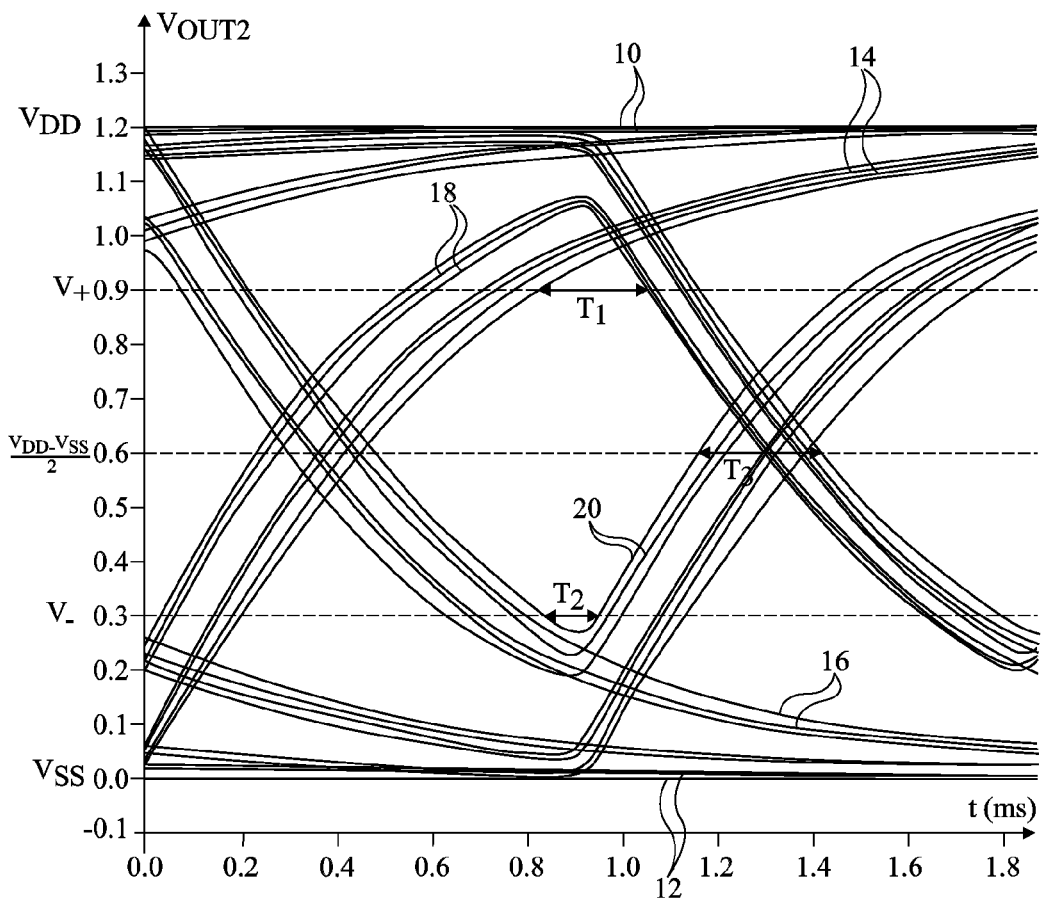
FIG. 2, previously described, illustrates various curves of the output voltage of the circuit of FIG. 1.
Figure 6:
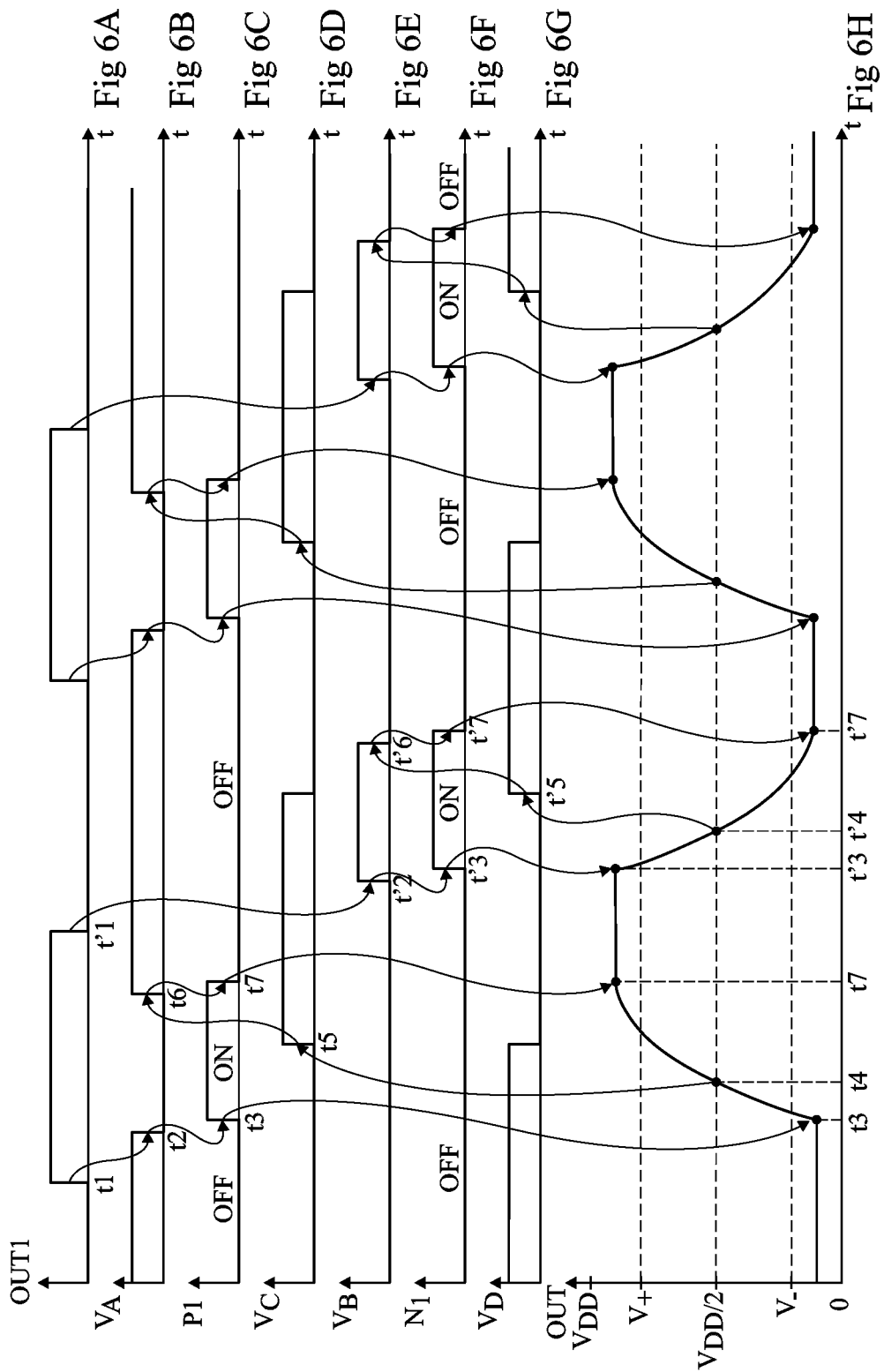
FIGS. 6A to 6H are timing diagrams illustrating the operation of the buffer of FIG. 5.
Figure 7:
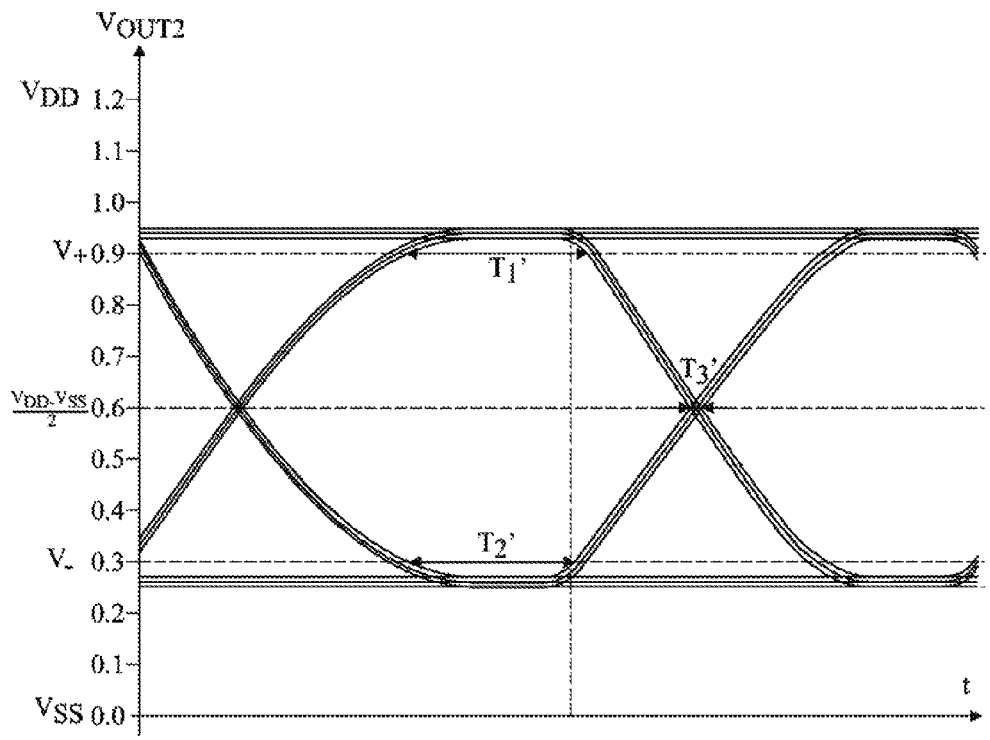
FIG. 7 illustrates various curves of the output voltage of the buffer of FIG. 5.

FIG. 7 illustrates a set of time curves over a transmission period (two bit times) of output $V_{OUT2}$ of the circuit of FIG. 5 in different configurations and value switchings of input signal OUT1 (similar to FIG. 2). It should be noted, in this drawing, that eye opening T1' in the high state and T2' in the low state is much greater than that obtained with the circuit of FIG. 1 (see FIG. 2). Thus, the limitation to a predetermined value of the voltage excursion of output OUT2 enables an increase in the eye opening of the circuit. It should also be noted that jitter T'3 of the circuit is also strongly attenuated with respect to the case of FIG. 2.

The present invention enables insurance that, at each end of a bit time, the output voltage of the circuit reaches a fixed voltage, in the example of FIG. 7, approximately 0.95 V in the case of a high input state and approximately 0.25 V in the case of a low input state of the circuit. Thus, for each variation of the circuit input, the circuit starts from similar states. The voltage excursion of output OUT2 is obtained by adjusting reference values $V_1$ and $V_2$ of comparators 40 and 42. By modifying these values, it is thus possible to obtain asymmetrical signals or, in the case where the switching times of transistors P1 and N1 are different, symmetrical signals by adjusting the values of $V_1$ and $V_2$ to attenuate the differences between the switching times of transistors P1 and N1.

Figure 8:
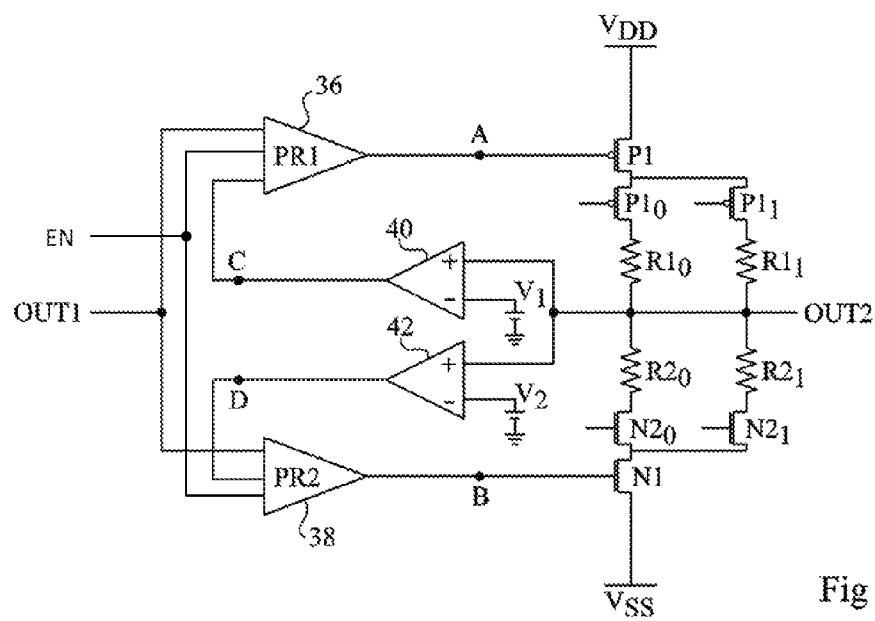
FIG. 8 illustrates an alternative embodiment of the buffer of FIG. 5.

FIG. 8 illustrates an alternative embodiment in which variable resistors R1 and R2 are replaced with a device comprising one or several parallel branches (two branches are shown in FIG. 8) each comprising an association of a first resistor ($R1_0$, $R1_1$) and of a second resistor ($R2_0$, $R2_1$), the junction point of the first and second resistors being connected to output OUT2. Each of the resistors of the output circuit is associated with a MOS transistor forming a switch (a P-type transistor, $P1_0$, $P1_1$, respectively for first resistors $R1_0$, $R1_1$, and an N-type transistor, $N2_0$, $N2_1$, respectively for second resistors $R2_0$, $R2_1$) which enables setting the output resistance of the circuit to a predetermined value, or balancing the circuit in the case where the on-state resistances of transistors P1 and N1 would not be equal.

Specific embodiments of the present invention have been described. Various alterations and modifications will occur to those skilled in the art. In particular, it should be noted that other variations known in the case of buffers such as that in FIG. 1 may also be applied to the circuit of FIG. 5.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A buffer circuit comprising:
    an output circuit comprising a series connection, between two terminals of application of a power supply voltage, of a first MOS transistor, a first and a second resistor of adjustable values, and a second MOS transistor,
    control means for controlling said first and second MOS transistors, and receiving an input signal, and
    comparison means for comparing the voltage on an output terminal of the buffer circuit with a threshold voltage, the comparison means being connected to said control means, the comparison means comprising a first and a second comparator, each receiving, on a first one of its input terminals, a signal from the output terminal and, on a second one of its input terminals, respectively, a first and a second threshold voltage, the first and second threshold voltages being equal.

2. The circuit of claim 1, wherein the control means comprises a first and a second control circuit the outputs of which are respectively connected to a respective gate of the first and second MOS transistors, and having at least a first input connected to the input terminal of the buffer circuit and having a second input respectively connected to the output of the first and of the second comparator.

3. The circuit of claim 2, wherein the first control circuit is adapted to turn on the first MOS transistor when the signal on the input terminal is in a high state and to turn off the first MOS transistor when the output of the first comparator is in a state corresponding to an output voltage of the buffer circuit greater than the first threshold voltage.

4. The circuit of claim 3, wherein the second control circuit is adapted to turn on the second MOS transistor when the signal on the input terminal is in a low state and to turn off the second MOS transistor when the output of the second comparator is in a state corresponding to an output voltage of the buffer circuit less than the second threshold voltage.

5. The circuit of claim 1, further comprising a second input terminal, intended to receive a signal for enabling the circuit, connected to the input of the control means, said first and second control means being provided to operate normally when said enable signal is in a first state and to turn off the first and second transistors when said enable signal is in a second state.

6. The circuit of claim 1, wherein the input signal on an input terminal has a 530-MHz frequency.

7. A system comprising:
    a signal generating circuit having a first output node;
    an output buffer having a first input node coupled to said first output node, and a second output node, said output buffer including:
        a control circuit having a second input node coupled to the first input node, a third input node coupled to a comparison circuit, and a third output node coupled to an output circuit;

said comparison circuit, having a fourth input node coupled to said second output node, a fifth input node coupled to a first reference voltage, and a sixth input node coupled to a second reference voltage; and said output circuit having a seventh input node coupled to said third output of said control circuit and having a fourth output node coupled to said fourth input node of said comparison circuit, and having a series connection, between two terminals of application of a power supply voltage, a first MOS transistor, a first and a second resistor of adjustable values, and a second MOS transistor, the first and second resistors of adjustable values respectively including a plurality of parallel branches, each branch having a first terminal at a power supply node and a second terminal at the second output node and each branch including a resistive element and a transistor element in series.

8. The system of claim 7 wherein said signal generating circuit is a data processing circuit.

9. The system of claim 7 further comprising a capacitive load coupled to said second output node.

10. The system of claim 7 wherein said control circuit further comprises an eighth input node configured to receive an enable signal.

11. The system of claim 7 wherein said control circuit further comprises:
   a first component configured to receive a signal from said signal generating circuit and a first comparison signal from said comparison circuit; and
   a second component configured to receive said signal from said signal generating circuit and a second comparison signal from said comparison circuit.

12. The system of claim 7 wherein said comparison circuit further comprises:
   a first comparator configured to compare an output signal on said second output node to said first reference voltage and to generate a first comparison signal; and
   a second comparator configured to compare said output signal on said second output node to said second reference voltage and to generate a second comparison signal.

13. A method of buffering a signal comprising:
   receiving a signal;
   in response to receiving the signal, coupling an output node to a first voltage node, when the signal is of a first logical state;
   comparing a voltage level on the output node to a first and a second threshold voltage, the first and second threshold voltages being equal;
   decoupling the output node from the first voltage node when the voltage level on the output node exceeds the first threshold voltage; and
   maintaining the voltage level on the output node until the signal changes logical state;
   in response to receiving the signal, coupling the output node to a second voltage node, when the signal is of a second logical state;
   comparing a voltage level on the output node to the first and the second threshold voltage; and
   decoupling the output node from the second voltage node when the voltage level on the output node falls below the second threshold voltage.

14. The method of claim 13 wherein the first voltage node is a high power supply node and the second voltage node is a ground node.

15. The method of claim 14 wherein the first threshold voltage and the second threshold voltage are equal to a first difference divided by two, the first difference being the difference between a high power supply node voltage and a ground node voltage.

16. The method of claim 13 further comprising a capacitive load from the output node.

17. A buffer circuit comprising:
   an output circuit comprising a series connection, between two terminals of application of a power supply voltage, of a first MOS transistor, a first and a second resistor of adjustable values, and a second MOS transistor, wherein the first and second resistors of adjustable values respectively include a plurality of parallel branches, each branch having a first terminal at a power supply node and a second terminal at an output terminal of the buffer circuit and each branch including a resistive element and a transistor element in series,
   control means for controlling said first and second MOS transistors, and receiving an input signal, and
   comparison means for comparing the voltage on the output terminal of the buffer circuit with a threshold voltage, the comparison means being connected to said control means.

18. The circuit of claim 17 wherein the control means comprises a first and a second control circuit the outputs of which are respectively connected to a respective gate of the first and second MOS transistors, and having at least a first input connected to an input terminal of the buffer circuit and having a second input respectively connected to an output of a first and of a second comparator.

19. A system comprising:
   a signal generating circuit having a first output node;
   an output buffer having a first input node coupled to said first output node, and a second output node, said output buffer including:
      a control circuit having a second input node coupled to the first input node, a third input node coupled to a comparison circuit, and a third output node coupled to an output circuit;
      said comparison circuit, having a fourth input node coupled to said second output node, a fifth input node coupled to a first reference voltage, and a sixth input node coupled to a second reference voltage, the first reference voltage being equal to the second reference voltage; and
      said output circuit having a seventh input node coupled to said third output of said control circuit and having a fourth output node coupled to said fourth input node of said comparison circuit.

20. The system of claim 19 wherein said comparison circuit further comprises:
   a first comparator configured to compare an output signal on said second output node to said first reference voltage and to generate a first comparison signal; and
   a second comparator configured to compare said output signal on said second output node to said second reference voltage and to generate a second comparison signal.

* * * * *